(12) United States Patent
Hirosawa

(10) Patent No.: US 6,220,093 B1
(45) Date of Patent: *Apr. 24, 2001

(54) VIBRATORY GYROSCOPE

(75) Inventor: Nobuyuki Hirosawa, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/250,745

(22) Filed: Feb. 16, 1999

(30) Foreign Application Priority Data

Feb. 27, 1998 (JP) .................................................. 10-047717

(51) Int. Cl.[7] ........................................................ G01P 9/04
(52) U.S. Cl. .......................................................... 73/504.16
(58) Field of Search ................................. 73/493, 504.12, 73/504.14, 504.15, 504.16, 504.13; 310/345, 370

(56) References Cited

U.S. PATENT DOCUMENTS

| | | | |
|---|---|---|---|
| 5,581,032 | * 12/1996 | Uemura et al. | 73/493 |
| 5,767,404 | * 6/1998 | Kaiser et al. | 73/493 |
| 6,044,708 | * 4/2000 | Hirosawa | 73/504.15 |

FOREIGN PATENT DOCUMENTS 09289343    11/1997    (JP) .

\* cited by examiner

*Primary Examiner*—John E. Chapman
(74) *Attorney, Agent, or Firm*—Brinks Hofer Gilson & Lione

(57) ABSTRACT

An efficiently produced vibratory gyroscope having secure connections is provided. The vibratory gyroscope comprises a vibrator in which driving electrodes, grounding electrodes, and land sections electrically connected to the driving and grounding electrodes are formed. A holding member holds the vibrator, allowing it to vibrate. The vibratory gyroscope also comprises wiring patterns, vibrator-side end sections, a substrate-side end section and a wiring section positioned between the vibrator-side end sections and the substrate-side end section. The vibrator-side end sections are connected to a flexible wiring board comprising land sections electrically connected to the wiring sections and also electrically connected to the land sections of the vibrator and to the substrate-connection end section formed in the circuit-substrate-side end section of the flexible wiring board. A circuit substrate is electrically connected to the wiring patterns.

9 Claims, 17 Drawing Sheets

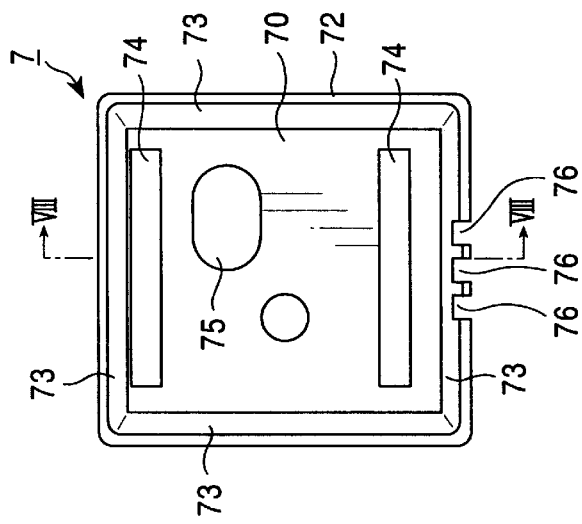
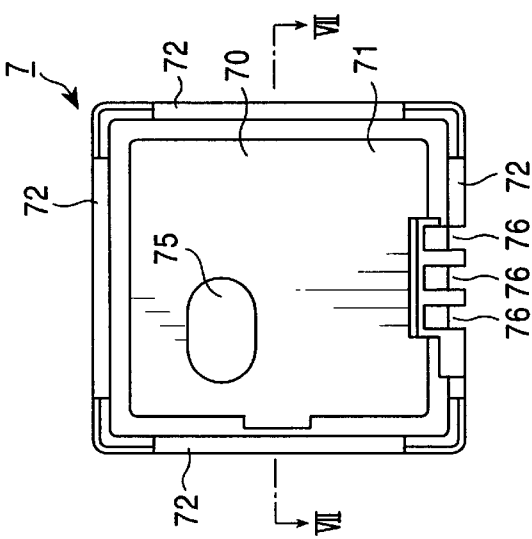
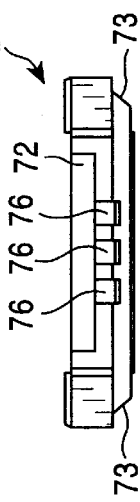
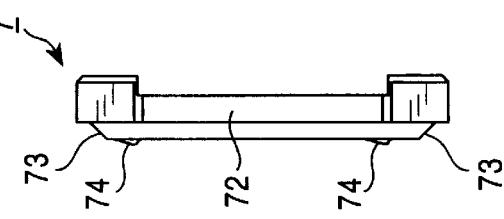

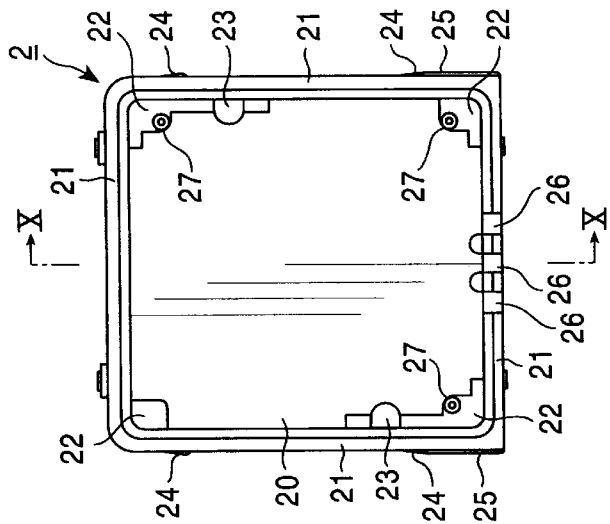
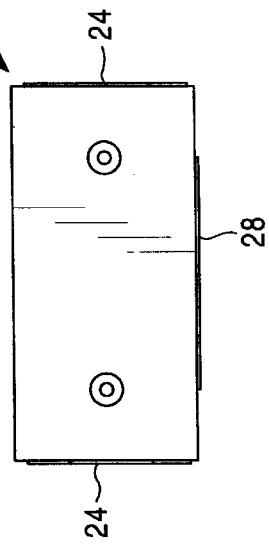
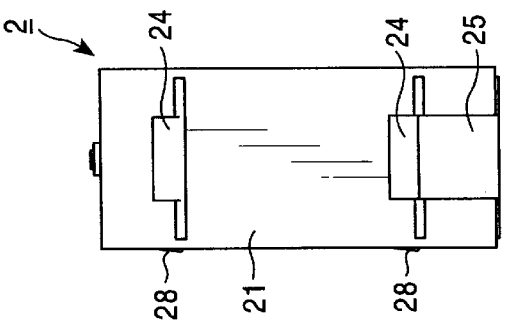
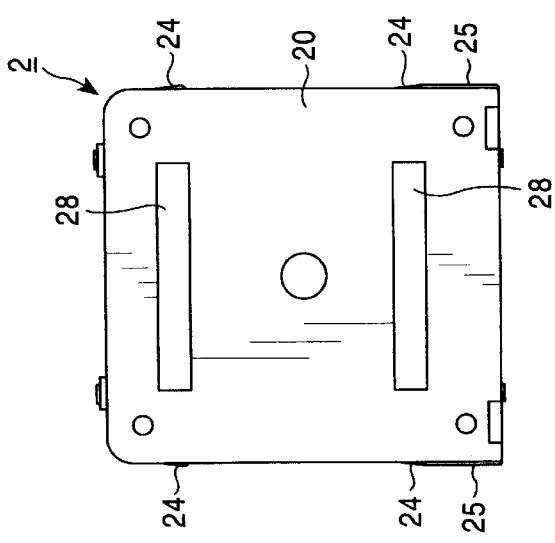
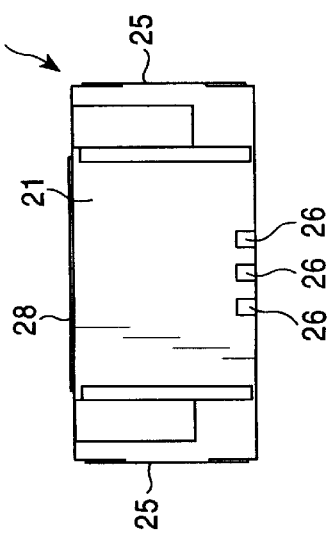

VIBRATORY GYROSCOPE

BACKGROUND OF THE INVENTION

1. Field of the Invention

The present invention relates to a vibratory gyroscope to be used, for example, in angular rotation velocity sensors for vehicle navigation systems.

2. Description of the Related Art

A vibratory gyroscope utilizes a dynamic phenomenon in which Coriolis force is generated at right angles to the vibration direction when a vibrating object is provided with an angular rotation velocity. The vibratory gyroscope has electrodes formed on plural faces of a vibrator thereof and alternating current (AC) is applied from an external source to the electrodes to obtain a detection output resulting from piezoelectric effects and relies on fine lead wires for electrical connection to the vibrator.

With the lead-wire connection, however, wires are apt to be cut in connection processing; therefore, wires must be connected one by one. In connection processing involving manual soldering, processing efficiency is significantly reduced.

SUMMARY OF THE INVENTION

In consideration of the above problems, objects of the present invention are to provide a vibratory gyroscope as follows:

- a vibratory gyroscope in which the connection strength can be made much higher than that of conventional vibratory gyroscopes and which allows the processing efficiency to be improved;
- a vibratory gyroscope in which vibration of a circuit substrate is not significantly transferred to the vibrator, and conversely, vibration of the vibrator is also not significantly transferred to the circuit substrate;
- a vibratory gyroscope in which the width of a wiring section is smaller to make it more difficult for vibration to be transferred between the circuit substrate and the vibrator;
- a vibratory gyroscope in which vibration of the vibrator is not significantly transferred to the circuit substrate;
- a vibratory gyroscope in which land sections are arranged on two opposite sides of the vibrator, but only a single flexible wiring board is sufficient;
- a vibratory gyroscope in which even when electrodes having identical potentials are formed on two opposite sides of the vibrator, the width of the wiring section is not allowed to be larger;
- a vibratory gyroscope in which vibration is well balanced;
- a vibratory gyroscope in which although plural wiring patterns and electrodes are formed, the connection processing can be achieved by a one-time operation for one side of the vibrator; and
- a vibratory gyroscope in which even when undesirable forces impinge on the land sections of the vibrator and wiring patterns, connections are not broken.

To achieve these objects, according to the present invention, there is provided a vibratory gyroscope that comprises a vibrator having electrodes and land sections electrically connected to the electrodes formed therein; a holding member to hold the vibrator so as to vibrate; a flexible wiring board comprising a wiring section in which wiring patterns are formed and which comprises at least vibrator-side end sections and circuit-substrate-side end sections and is positioned between the vibrator-side end sections and the circuit-substrate-side end sections, the vibrator-side end sections comprising land sections electrically connected to the wiring patterns and electrically connected to the land sections; and a circuit substrate connected to the land sections arranged on the circuit-substrate-side end section of the flexible wiring board and electrically connected to the wiring patterns.

In the above vibratory gyroscope, the wiring section of the flexible wiring board may be narrower than the vibrator-side end section and the circuit-substrate-side end section.

Furthermore, according to the present invention, a plurality of land sections of the vibrator may be formed, the corresponding land sections in the flexible wiring board may be connected within the vibrator-side end section to the land sections of the vibrator which are at least arranged to be adjacent to each other and have the same potentials, and they may be formed in the wiring section with the wiring patterns, which are electrically connected to the land sections of the flexible wiring board, arranged so as to be common.

Furthermore, according to the present invention, the vibrator may comprise vibration arms individually comprising a free end to vibrate in a state wherein one end is held, a base end section of the vibrator may be held by the holding member, the land sections of the vibrator-side end sections are arranged in the base end section of the vibrator, and the holding member is fixed with the circuit-substrate-side end section.

Furthermore, in the vibratory gyroscope according to the present invention, the vibrator may be in a plate-like shape and may comprise driving or detection electrodes on front and back sides thereof and the land sections electrically connected to the driving or detection electrodes; the flexible wiring board may comprise a branch section in which the wiring section branches into two sections in a side of the vibrator rather than the center side, the vibrator-side end section for the front side of the vibrator, and the vibrator-side end section for the back side of the vibrator; and land sections arranged in each of the vibrator-side end sections may be connected to corresponding land sections formed on the front and back sides of the vibrator.

In the above vibratory gyroscope, the wiring patterns individually connected to the land sections of the vibrator, which have the same potentials in the front and back sides of the vibrator, may be incorporated in the branch section and directed to the circuit-substrate-side end section.

In this case, according to the present invention, the wiring section may originate centrally from the vibrator-side end section.

Furthermore, in the above vibratory gyroscope, paste primarily comprising silver to form the electrodes and land sections of the vibrator, solders of solder paste or solder plating may be arranged in the land sections of the vibrator-side end sections of the flexible wiring board, and the solders may be allowed to melt by thermal welding to connect the land sections of the vibrator and the land sections of the flexible wiring board.

Furthermore, according to the present invention, an adhesive may be applied in sections thermal-welded to connect the land sections of the vibrator and the land sections of the flexible wiring board.

Furthermore, according to the present invention, lead wires are not used; but a flexible wiring board is used instead to connect the vibrator and the circuit substrate; therefore, the connection strength can be made much higher than that of conventional vibratory gyroscopes and the processing efficiency can also be improved.

Furthermore, according to the present invention, since the wiring section is narrower, vibration of a circuit substrate is not significantly transferred to the vibrator, and conversely, vibration of the vibrator is also not significantly transferred to the circuit substrate. This allows a detection signal retrieved from the vibrator to be relatively free of undesirable vibration influences.

Furthermore, since the wiring patterns are commonly used, the width of the wiring section can be arranged at smaller scales to make it more difficult for the transfer of vibration to occur between the circuit substrate and the vibrator.

Furthermore, since the land sections are arranged in the base end section of the vibrator held by the holding member and they are connected in this base end section to the land sections of the flexible wiring board, vibration of the vibrator is not significantly transferred to the circuit substrate.

Furthermore, land sections are arranged on two opposite sides of the vibrator, but the single flexible wiring board is sufficient. This allows manufacturing cost to be reduced, and compared to the case in which two flexible wiring boards are used, also allows the processing-efficiency to be improved.

Furthermore, since the common wiring patterns are arranged in the wiring section between the branch section and the circuit-board-side end section, even when electrodes having identical potentials are formed on two opposite sides of the vibrator, increase in the width of the wiring section can be avoided.

Furthermore, since the wiring section originates centrally from the vibrator-side end section, the vibration balance can be improved.

Furthermore, although plural wiring patterns and electrodes are formed, fewer connection processings can be achieved by thermal welding, by which the processing efficiency can further be improved.

Furthermore, even when undesirable forces impinge on the land sections of the vibrator and wiring patterns, connections are not broken.

BRIEF DESCRIPTION OF THE DRAWINGS

FIG. 6A is a plan view of the cover, FIG. 6B is a front view thereof, FIG. 6C is a bottom view thereof, FIG. 6D is a left-side view thereof, and FIG. 6E is a right-side view thereof;

FIG. 9A is a front view of a housing, FIG. 9B is a bottom view thereof, FIG. 9C is a right-side view thereof, FIG. 9D is a rear view thereof, and FIG. 9E is a plan view thereof;

DESCRIPTION OF THE PREFERRED EMBODIMENTS

Figure 1:
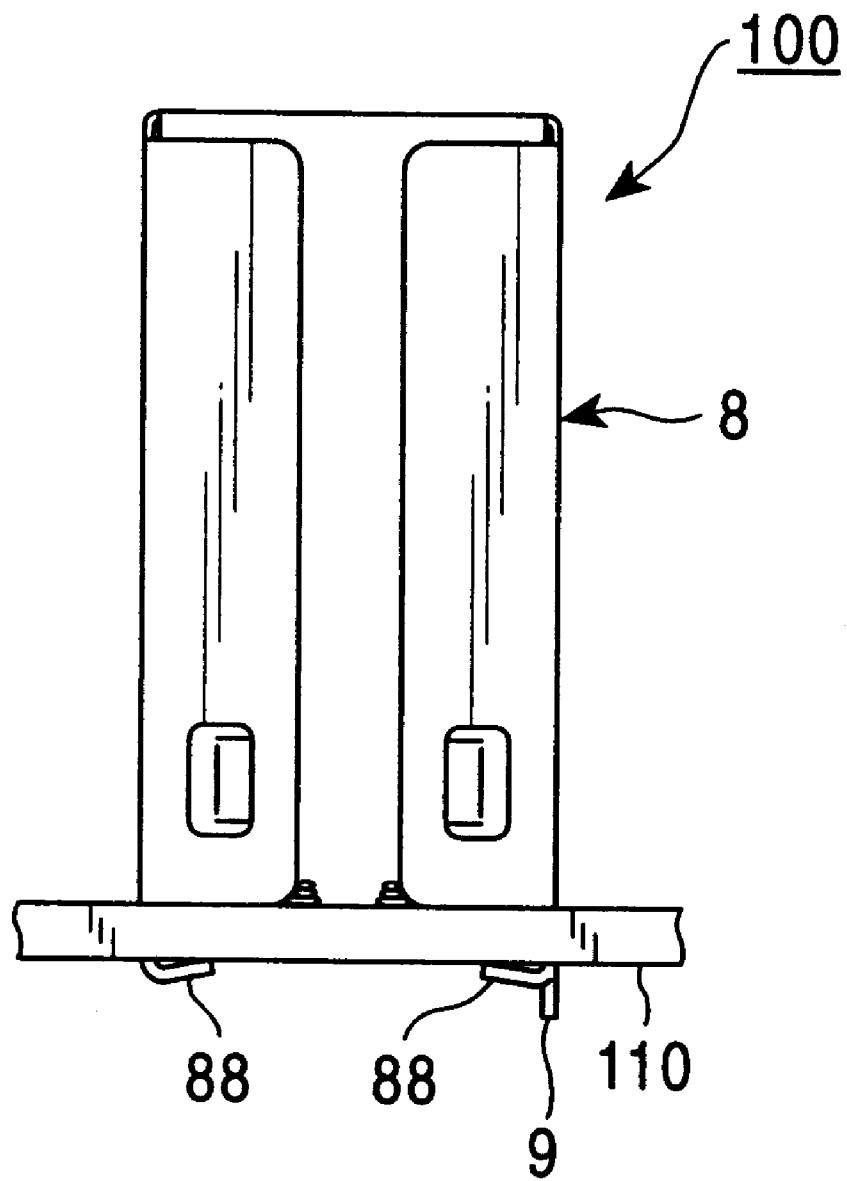
FIG. 1 is a side view of an embodiment according to the present invention.
Figure 2A:
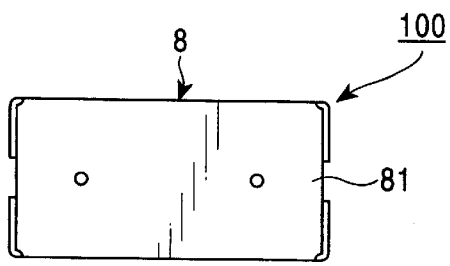
FIG. 2A is a plan view of a vibratory gyroscope.
Figure 2B:
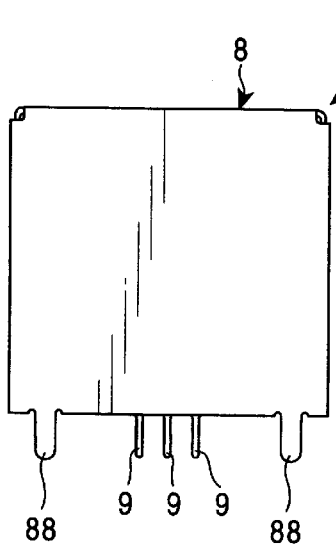
FIG. 2B is a front view thereof.
Figure 2D:
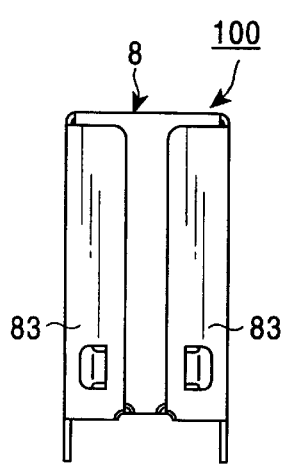
FIG. 2D is a right-side view thereof.
Figure 2E:
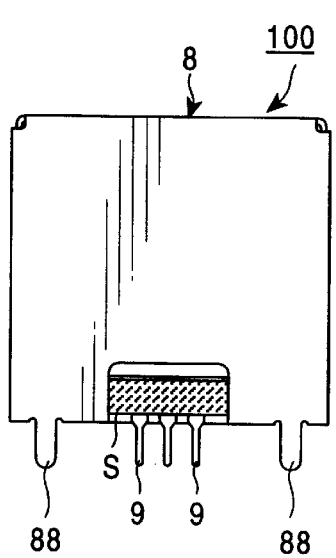
FIG. 2E is a rear view thereof.
Figure 2C:
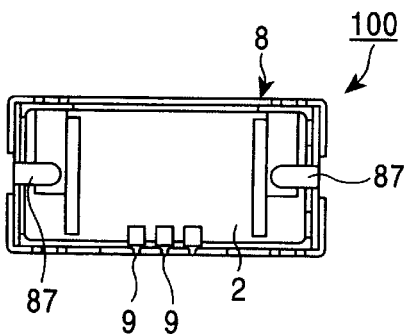
FIG. 2C is a bottom view thereof.

In FIG. 1, the number 100 represents a vibratory gyroscope having a built-in vibrator 1, which will be described later. The vibratory gyroscope 100 is, for example, fixed to a fixed board 110 of a vehicle navigator.

The vibrator 1 is of a three-legged tuning fork type (or a two-legged tuning fork type) used as a sensor of a gyroscope that generates a vibration component according to Coriolis force within a rotation system to detect angular velocity.

Figure 5:
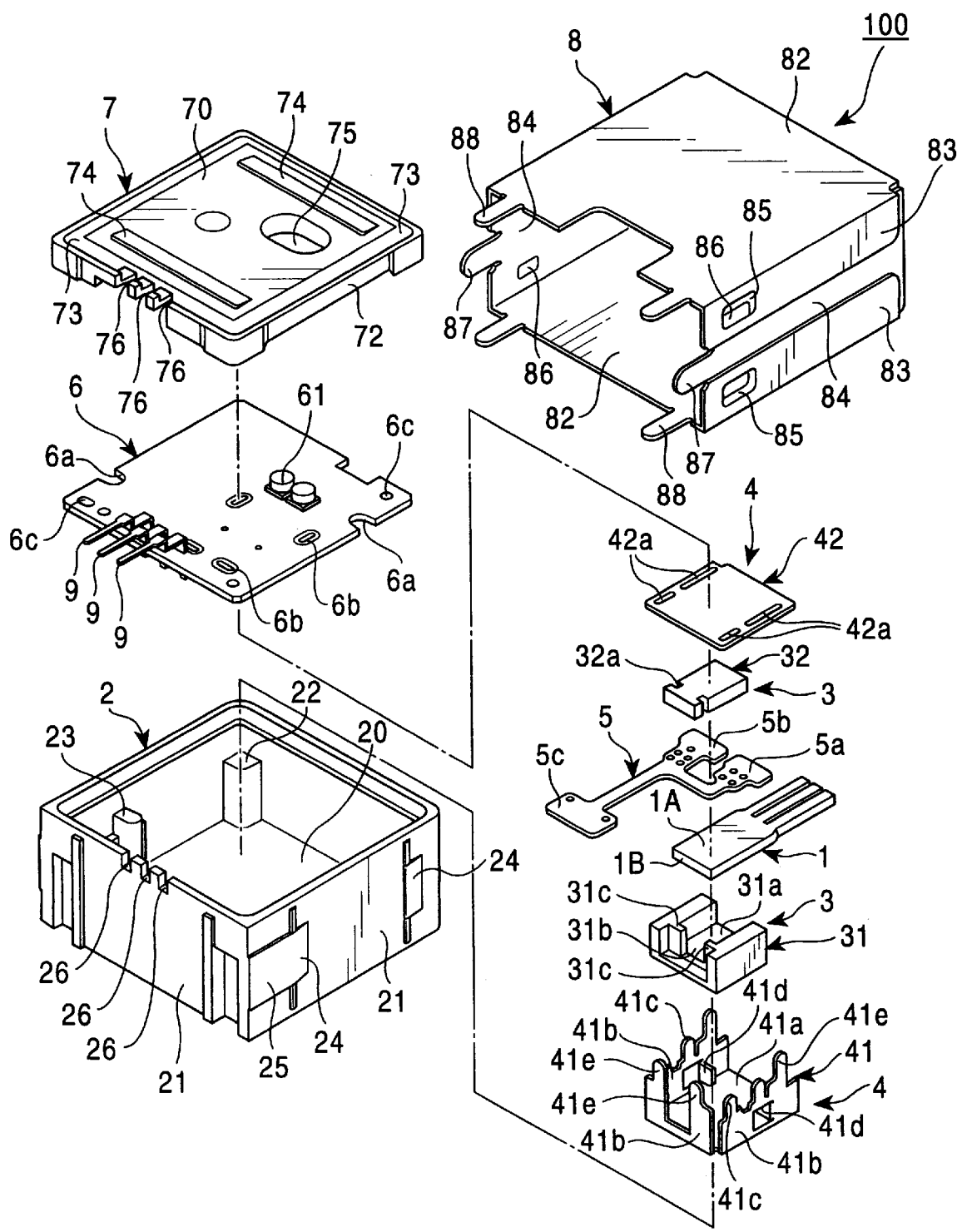
FIG. 5 is an exploded perspective view of the vibratory gyroscope.

As shown in FIG. 5, the vibratory gyroscope 100 is primarily comprised of a housing 2 of which an upper portion is open, a holding member 4 fixed through a base end section 1A of the vibrator 1, which is sandwiched and fixed by a vibration isolation rubber member 3, a flexible wiring board 5 connected and fixed to the base end section 1A of the vibrator 1 by thermal-welding, a substrate (circuit substrate) 6 on which the vibrator 1 fixed with a holding member 4 is fixed, a cover 7 to cover the opening of the housing 2 that accommodates the substrate 6, and a shield cover 8 to shield external surfaces of the housing 2 and the cover 7 that are coupled into one assembly.

The vibrator 1 is either like a plate having a surface of an elastic material, such as elinbar, on which a piezoelectric material used as a driving means and a detecting means is layered, or is like a plate entirely formed of the piezoelectric material used as the driving means and the detecting means. On the piezoelectric-material surface, driving electrodes for driving vibration arms and detection electrodes for detecting vibration are formed.

Figure 11:
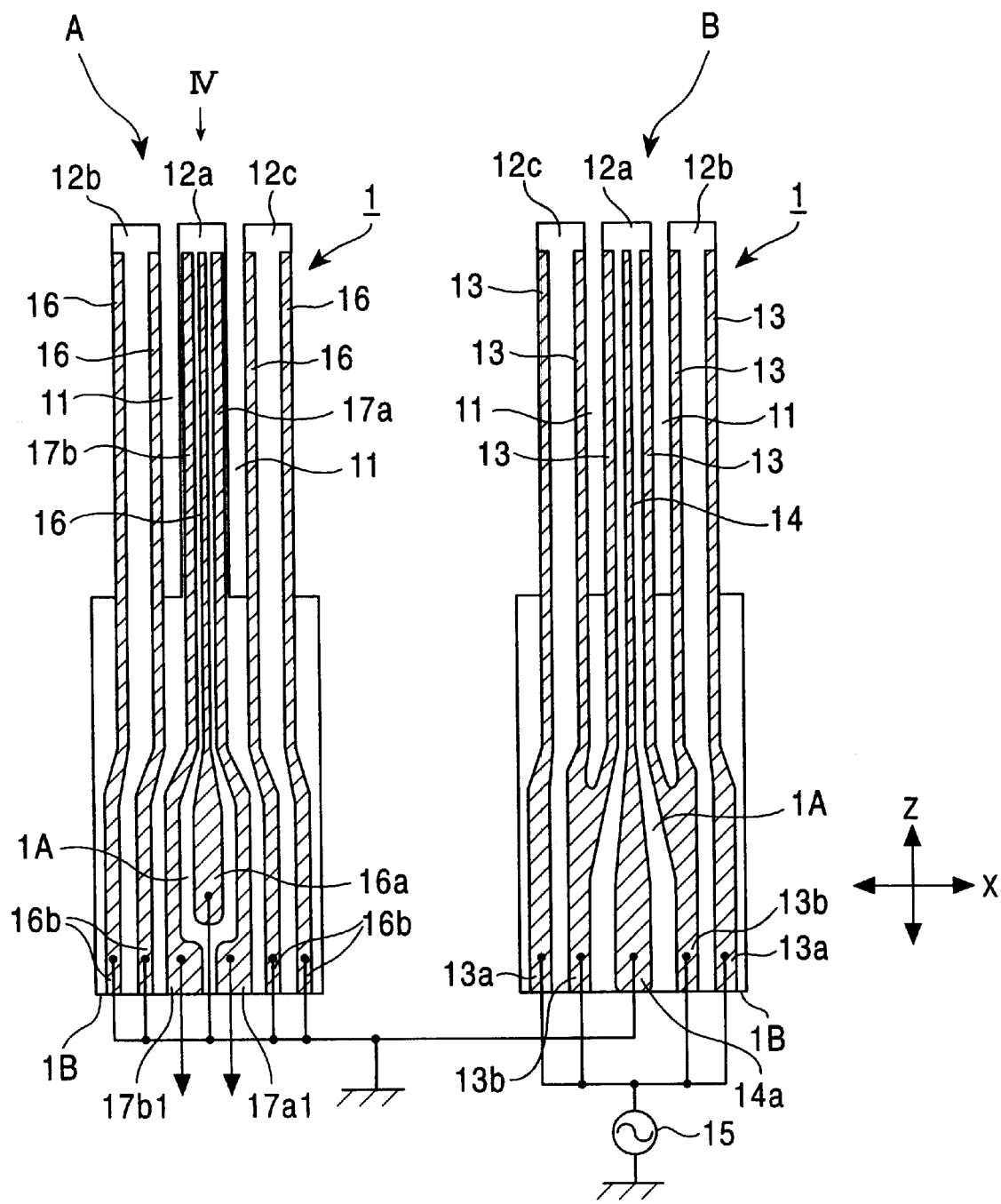
FIG. 11 illustrates front and rear views of the vibrator at a drive-detection time.

In this embodiment, the vibrator 1 is a plate formed of a piezoelectric ceramic material, such as PZT (lead zirconate titanate). As shown in FIG. 11, in the vibrator 1, an end portion of the base end section 1A is formed in a single unit of three vibration arms 12a, 12b, and 12c, each of which is spaced by a gap 11.

Figure 12:
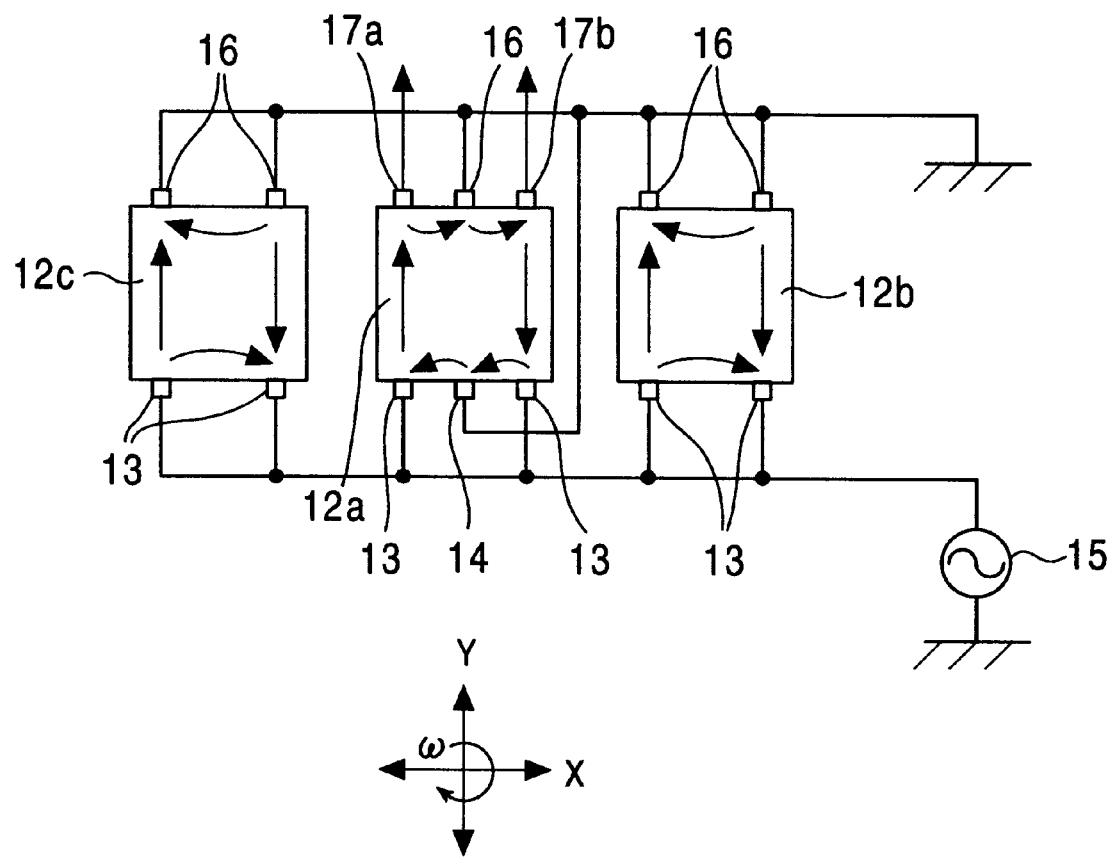
FIG. 12 is a explanatory drawing to be used for explanation of dielectric-polarization directions of the vibrator as viewed as directed by arrow IV in FIG. 11.

In FIG. 12 dielectric-polarization directions of the vibration arms 12a, 12b, and 12c are indicated by arrows. As shown therein, the vibration arms 12b and 12c at the individual right-left ends have the same dielectric-polarization directions, and in the vibration arm 12a in the center, the dielectric-polarization directions are symmetrical with those of the arms 12b and 12c with respect to the up-down and right-left directions.

On each of the vibration arms 12a, 12b, and 12c, a pair of driving electrodes 13 made of a conductive material is formed on the bottom face (back side) and extends to an end face 1B of the vibrator 1 to form land sections 13a and 13b. The land section 13b is connected to two driving electrodes 13 through conductive paths. These electrodes 13 are connected to an AC driving power source 15 through conductive paths to be supplied with driving voltage of the same constant potential.

The middle vibration arm 12a has a grounding electrode 14 in the back side. This grounding electrode 14 is extended to the end face 1B of the vibrator 1 to form a land section 14a which is a grounding potential through a wiring path. The two electrodes applied with the same potential are incorporated into one land section 13b in their one-end sections. By this arrangement, the number of land sections can be decreased; therefore, efficiency of processing such as soldering can be improved.

A pair of grounding electrodes 16 are formed on the upper face (front side), a pair of detection electrodes 17a and 17b are formed on the middle vibration arm 12a, and one grounding electrode 16 is formed between the detection electrodes 17a and 17b of the middle vibration arm 12a. As shown in FIG. 11A, four grounding electrodes 16 formed on the vibration arms 12b and 12c are extended up to the end face 1B of the base end sections 1A of the vibrator 1 and respective land sections 16b are formed on the base end section 1A, while a single grounding electrode 16 formed on the middle vibration arm 12a is extended to a position before the end face 1B of the vibrator 1 and a land section 16a is formed on the base end section 1A. These grounding electrodes are grounding potentials through wiring paths.

For reference, the driving electrode 13, the grounding electrodes 14 and 16, and the detection electrodes 17a and 17b print-formed of a silver-palladium compound paste, such as a silver paste or a silver-palladium paste primarily comprising silver. In this embodiment, silver paste, which does not contain expensive palladium, is used. After the silver-paste printing, baking is performed to evaporate a solvent used to liquefy silver powder and a binder material. Dried electrode patterns created in this way are used in this embodiment.

Regarding the land sections 13a, 13b, and 14a, they are print-formed concurrently with the driving electrodes 13 and the grounding electrode 14. Regarding the land sections 16a and land sections 16b and land sections 17a1 and 17b1 (to be described later), they are print-formed concurrently with the grounding electrode 16 and the detection electrodes 17a and 17b.

The driving electrodes 13, the grounding electrode 14, and the grounding electrodes 16 provide driving voltage to the piezoelectric material, which is a driving means. In accordance with a dielectric polarization structure in FIG. 12, the left and right vibration arms 12b and 12c are vibration-driven in an X-direction in the same phase, while the middle vibration arm 12a is also vibration-driven in the X-direction, but in a phase opposite to the phase for the vibration arms 12b and 12c (180-degree different phase). That is, at one time, an X-direction amplitude of the left and right vibration arms 12b and 12c is in the reverse direction of an X-direction amplitude of the middle vibration arm 12a.

For reference, when the grounding electrode 14 and the grounding electrodes 16 are not grounded, the vibration arms 12a, 12b, and 12c are not vibration-driven. In this case, the grounding electrode 14 and the grounding electrodes 16 functions as diving electrodes.

On an upper face of the middle vibration arm 12a, the pair of detection electrodes 17a and 17b is formed. Each of the detection electrodes 17a and 17b is extended to the position of the end face 1B in the back side of the vibrator 1. The respective detection electrodes 17a and 17b have land sections 17a1 and 17b1 in a single unit. These land sections 17a1 and 17b1 are widely formed on the base end section 1A, since the land section 16a of the grounding electrode 16 is not extended to reach the end face 1B of the base end section 1A of the vibrator 1.

In FIG. 11, the individual driving electrodes 13 are electrically connected to conductive patterns (circuit patterns) of the substrate 6 through flexible wiring board 5 (not shown) and further connected to the AC driving power source 15. Furthermore, the individual grounding electrode 14, grounding electrodes 16, and detection electrodes 17a and 17b are also connected to predefined conductive patterns of the substrate 6 thorough the flexible wiring board 5.

One end portion of the flexible wiring board 5 is branched into two fork edge sections on which a vibrator-front-side-connection end section 5a and a vibrator-back-side-connection end section 5b are arranged, respectively, and are thermal-welded with front-side and back-side land sections of the vibrator 1. On another end portion of the flexible wiring board 5, a substrate-connection end section 5c is arranged and is connected to a conductive pattern (not shown). Detailed description of individual arrangements and connections will be given later.

The vibrator 1 is held at one end by the holding member 4 to minimize components. Furthermore, the base end section 1A of the vibrator 1 is held by the holding member 4 to stabilize the vibrator 1. Furthermore, the vibrator 1 is fixed on the substrate 6 through the vibration isolation rubber member 3; therefore, vibration and shocks externally impinging on the substrate 6 can be buffered and the vibrator 1 can be prevented from directly transferred shocks and vibration.

Furthermore, it is notable that in the vibrator 1 of a three-legged tuning fork type shown in FIG. 1, the left and right vibration arms 12b and 12c and the middle vibration arm 12a vibrate in 180-degree different phase to vibrate the vibrator 1 in overall good vibration balance. Therefore, even when vibration is caused in the base end section 1A of the vibrator 1, the vibration becomes much smaller. According to these arrangements, in a state in which the base end section 1A is held by the holding member 4, the vibration arms 12a, 12b, and 12c are allowed to vibrate without being restricted because of the holding method and driving capability, in which detecting sensitivity of the individual vibration arms is not lowered.

When the mass of the vibration arm is represented by m, the X-axis-direction vibration velocity of the vibration arm is represented by v (vector value), and the angular velocity at the about-Z-axis rotation in a rotation system is represented by $\omega 0$ (vector value), the Coriolis force F is expressed by the following formula:

$$F = 2m(v \times \omega 0) \text{ (x is a vector product)}$$

This shows the Coriolis force is proportional to the angular velocity ω0. Accordingly, the angular velocity can be obtained when the Y-axis-direction variation vibration of the vibration arm 12a is detected by the detection electrode.

When the vibrator 1 is placed within a rotation system having an about-Z-axis-rotation angular velocity, the individual vibration arms 12a, 12b, and 12c have a Y-direction vibration component according to the Coriolis force as expressed above. Since the vibration arms 12b and 12c at the two opposite sides and the vibration arm 12a in the middle have vibration phases opposite to each other, the phases according to the Coriolis force are also opposite to each other for the vibration arms 12b and 12c and the vibration arm 12a. That is, at one time, the Y-axis amplitude directions of the vibration arms 12b and 12c according to the Coriolis force are the same and are opposite to the Y-axis amplitude direction of the middle vibration arm 12a.

The detection electrodes 17a and 17b are formed on the same face of the middle vibration arm 12a, and the piezoelectric material of the arm 12a functions as a detecting means to detect the Coriolis force. The piezoelectric material areas where the detection electrodes 17a and 17b are formed have dielectric polarization directions which oppose each other; therefore, with respect to the Y-direction vibration component, the detection electrodes 17a and 17b can yield piezoelectric-effect detection outputs according to 180-degree different phase. In this case, the difference between the detection outputs from these detection electrodes 17a and 17b is taken out, by which an absolute value of the detection outputs from the detection electrodes 17a and 17b is added. This detection output is used to allow the about-Z-axis-rotation angular velocity ω component to be produced.

Figures 3A, 3B:
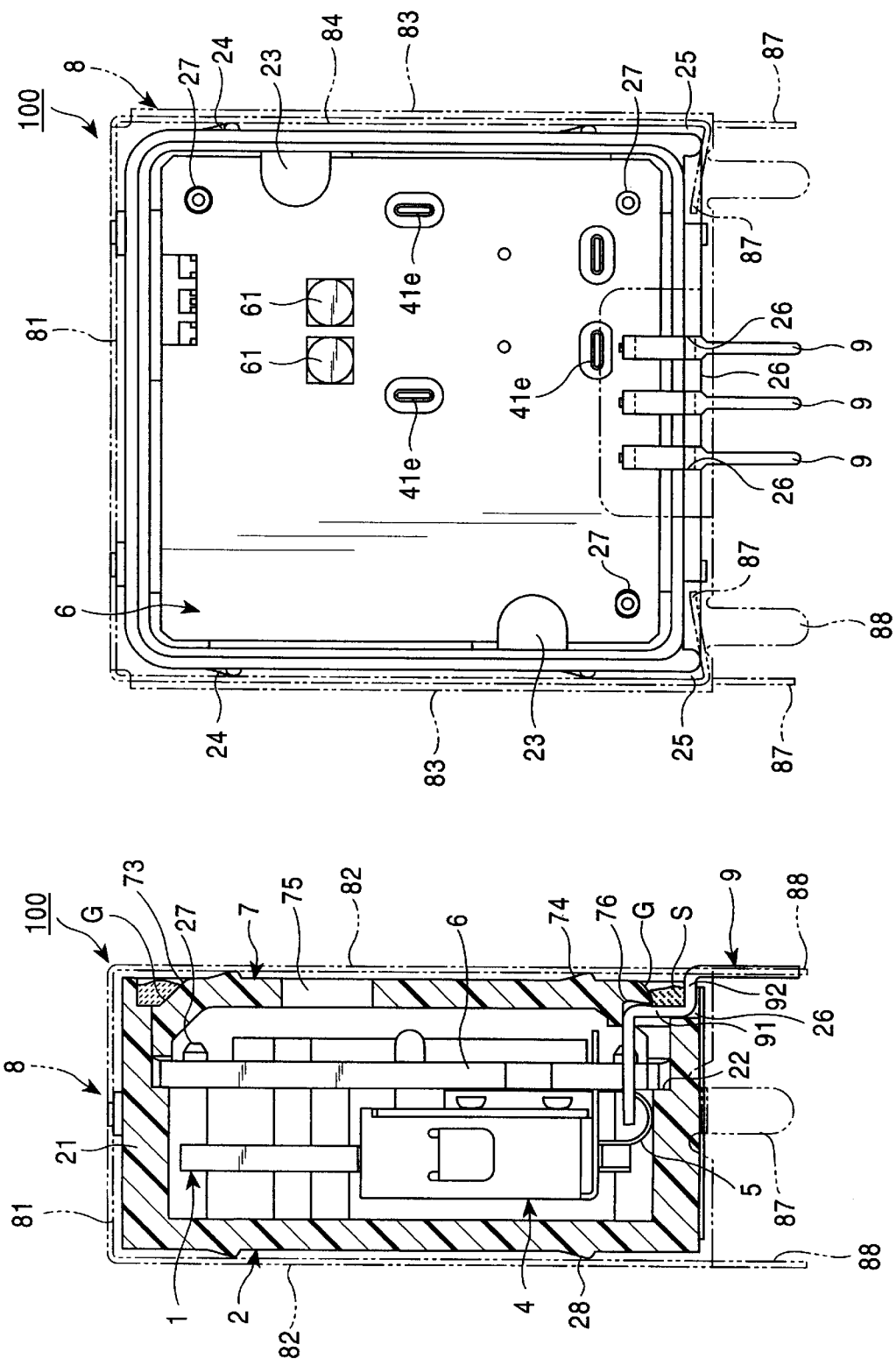
FIG. 3A is a longitudinal cross-sectional view transparently taken through a shield cover of the vibratory gyroscope.
FIG. 3B is a rear view of the vibratory gyroscope in which the cover is removed.
Figure 4A:
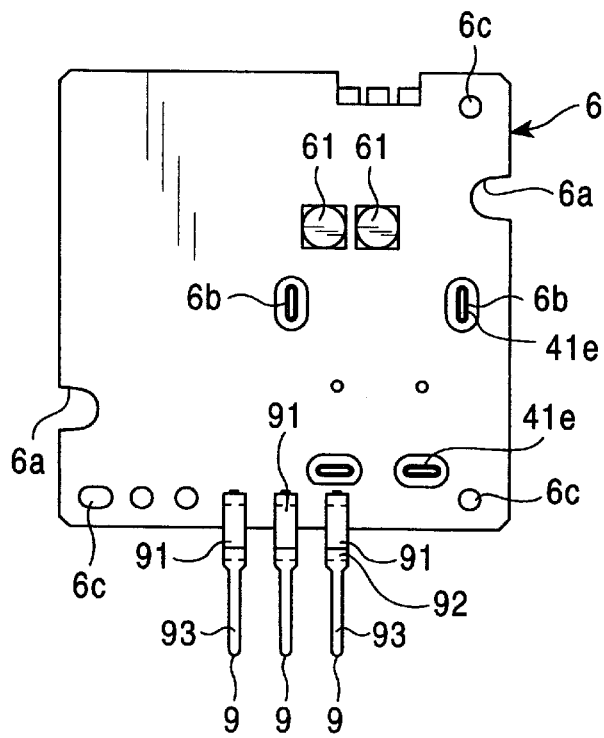
FIG. 4A is a rear view of a vibrator fixed with a substrate with a holding member.
Figure 4B:
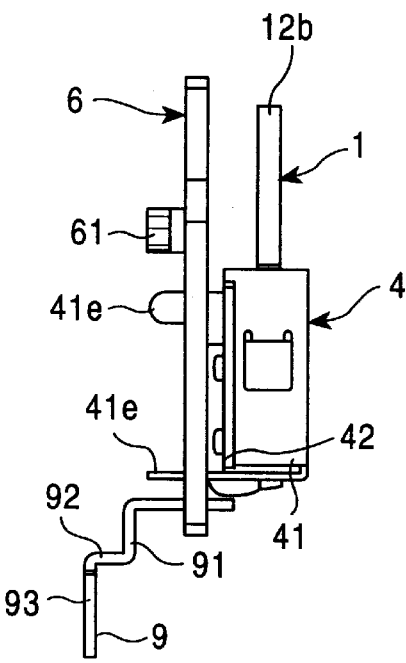
FIG. 4B is a left-side view thereof.
Figure 4C:
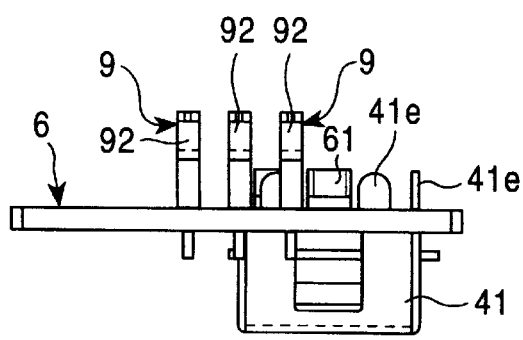
FIG. 4C is a bottom view thereof.

As shown in FIGS. 3 and 4, the base end section 1A of the vibrator 1 is sandwiched by the vibration isolation rubber member 3 and is then held by the holding member 4. As shown in FIG. 5, this holding member 4 comprises a holding member case 41 and a holding member cover 42 that is fitted to the holding member case 41 containing the vibration isolation rubber member 3.

The holding member case 41 is bent and formed of a 0.3-mm thick phosphor-bronze plate. As shown in FIG. 5, this holding member case 41 comprises a square-plate-like and plane-bottom plate section 41a, side plate sections 41b bent and formed at three sides of the plane-bottom plate section 41a, fixing tab sections 41c projecting on upper ends of the side plate sections 41b for fixing the holding member cover 42, a positioning tab section 41d for the vibration isolation rubber member 3 which is cut and raised to the inside from the opposing side plate sections 41b, and fixing tab sections 41e so as to be fitted to the substrate 6 projecting on the upper ends of the side plate sections 41b.

On the holding member cover 42 formed of a 0.5-mm thick plane-phosphor-bronze plate, slits 42a in which fixing tab sections 41c and 41e and the like are inserted are formed.

The vibration isolation rubber member 3 made of silicon rubber, which does not substantially vary in hardness according to temperature, comprises first and second vibration isolation rubber members 31 and 32. As shown in FIG. 5, the first vibration isolation rubber member 31 has a concave section 31a in which the base end section 1A of the vibrator 1 is inserted, a notch section 31b to draw out the flexible wiring board 5 welded and fixed with the base end section 1A of the vibrator 1, and a pair of wall sections 31c forming the notch section 31b. The second vibration isolation rubber member 32 is like a square plate and has, on the two opposite sides, notch sections 32a in which the wall sections 31c are inserted.

The first vibration isolation rubber member 31 is inserted in the holding member case 41. The vibrator 1 is fixed by thermal welding with the base end section 1A of the vibrator 1 inserted with the base end section 1A into the concave section 31a of the first vibration isolation rubber member 31. Further, the second vibration isolation rubber member 32 is inserted in such a manner that the base end section IA of the vibrator 1 is inserted so as to be sandwiched to the wall sections 31c of the first vibration isolation rubber member 31 and to the notch sections 32a of the second vibration isolation rubber member 32, the holding member cover 42 is fitted on, and the protruding fixing tab sections 41c are bent. In this way, the holding member 4 is fitted to the vibrator 1. In this case, with compressibility of the vibration isolation rubber member 3 arranged to be 10 to 30%, the base end section 1A of the vibrator I is sandwich-fitted by the holding member 4 between the first and second vibration isolation rubber members 31 and 32. The tab sections 41e of this holding member 4 are inserted into slits (holes 6b) of the substrate 6 and soldered on the rear.

In this way, as shown in FIG. 4, the vibrator 1 is fixed to the substrate 6 by the holding member 4 through the vibration isolation rubber member 3. This embodiment is used in a state in which the base end section 1A of the vibrator 1 is positioned downward and the vibration arms 12a, 12b, and 12c are positioned upward.

Figure 10:
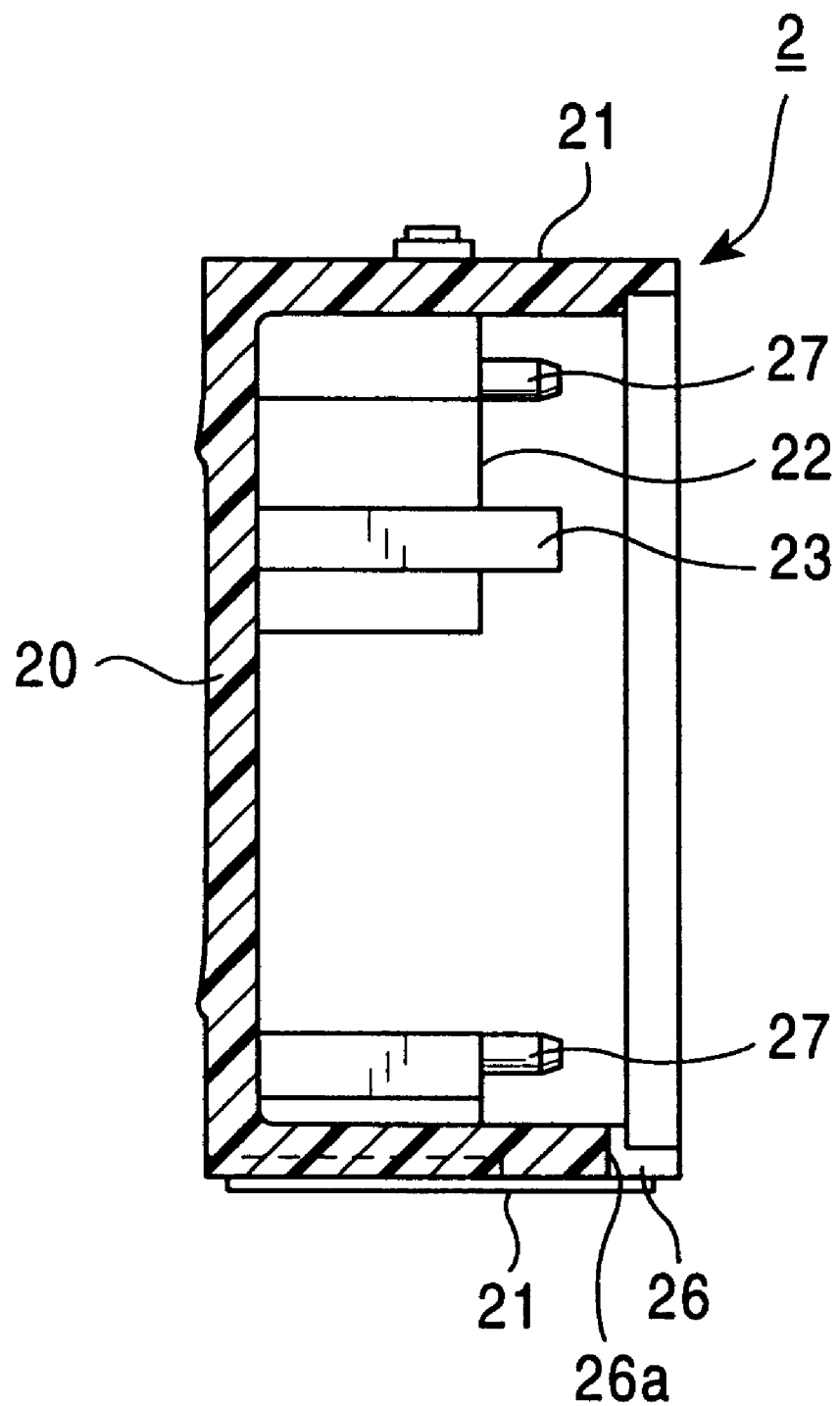
FIG. 10 is a cross-sectional view taken along line 10—10 of FIG. 9D.

The housing 2 is like a square box having an opening in the upper side and is formed of a synthetic resin. As shown in FIGS. 9 and 10, it has a square bottom section 20, side walls 21 formed on the four sides of the bottom section 20, height determination sections 22 arranged inside of the side walls 21 which are used to determine the height of the substrate 6, fixing ribs 23 to be fitted to notch sections 6a for positioning the substrate 6 and to fix the substrate 6 with protruded portions thermal-caulked, tapered sections 24 arranged on outside faces of the opposing side walls 21 to work as guides for insertion of the shield cover 8, convex sections 25 continuously formed on the tapered sections 24 to work as receiving sections when fall-out prevention tabs 87 of the shield cover 8 are bent, notch sections 26 to allow terminals 9 to pass out of the housing 2, positioning guide pins 27 for the substrate 6, and tapered sections 28 formed on the bottom section 20 to work as a guide when the shield cover 8 is inserted. Bottom faces 26a of the notch sections 26 are flat surfaces, as shown in FIG. 10.

As a material of the housing 2 and the cover, an engineering plastic, such as PBT (polybutylene terephthalate), PPS (polyphenylene sufide), and ABS (acryloritrile-butadience-styrene), may be used. From a viewpoint of characteristics for heat resistance and strength, PBT is preferable. Furthermore, the bottom section of the housing 2 may be arranged to be an opening with a bottom cover used to close the bottom opening.

The rigid circuit substrate 6 is made of a material such as a glass-reinforced epoxy resin and detection circuits and the like are mounted thereon. As shown in FIGS. 4 and 5, it also comprises the notch sections 6a to receive the fixing ribs 23, the insertion holes 6b to receive the fixing tab sections 41e of the holding member case 41, guide holes 6c to receive the guide pins 27, and the terminals 9 connected and fixed to patterns that are connected to the detection circuits and the like. The number 61 represents a semi-fixed variable resistor.

As shown in FIGS. 3 and 4, the terminal 9 is formed in a two-step shape when it is viewed overall. It comprises a first horizontal plate section 91 that is bent and formed substantially parallel to the surface of the circuit substrate 6, a first vertical plate section 92 that is bent and formed to be substantially perpendicular to the first horizontal plate section 91, and a second horizontal plate section 93 that is bent and formed to be substantially perpendicular to the first vertical plate section 93.

Figure 7:
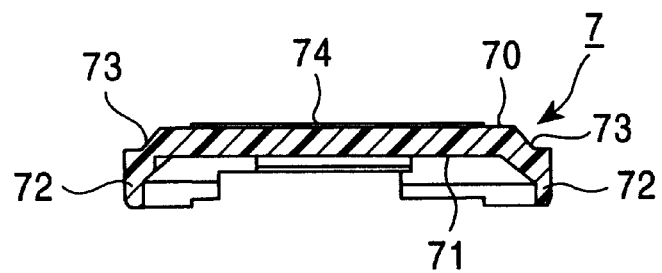
FIG. 7 is a cross-sectional view taken along line VII—VII of FIG. 6B.
Figure 8:
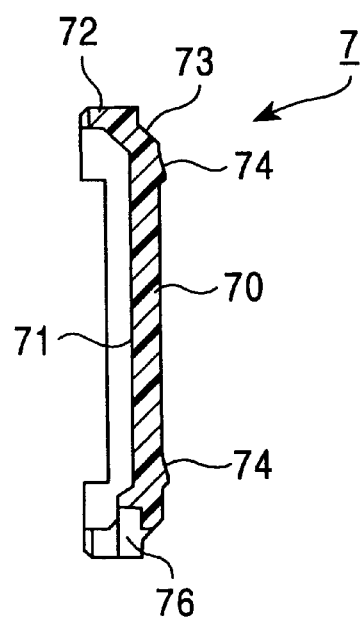
FIG. 8 is a cross-sectional view taken along line VIII—VIII of FIG. 6E.

The cover 7 is formed like a square plate overall so as to be positioned inside of the side walls 21 of the housing 2 so as to close the opening. As shown in FIGS. 6 to 8, the cover 7 comprises a concave section (internal bottom section) 71 formed on the lower surface of a flat section 70, side walls 72 formed to surround the concave section 71, tapered face sections 73 formed along the periphery of the upper-face side of the flat section 70, tapered sections 74 projecting on the upper face side of the flat section 70 to work as a guide when the shield cover 8 is inserted, a vent 75 used for releasing air in the housing 2 when heating is performed to fix the cover 7 and the housing 2 together, and derivation notch sections 76 for terminals 9 notch-formed on the side walls 72.

When viewed overall, the cover 7 is also like an upsidedown dish. As shown in FIG. 3, concave gap portions G are formed by the tapered face sections 73 of the cover 7 and the upper end sections of the side walls 21 of the housing 2 along the periphery of the cover 7 (connected section of the cover 7 and the housing 2). The concave gap sections G are filled with an adhesive S (diagonally broken line portions). This allows the use of the adhesive S in only the connected portions of the cover 7 and the housing 2. For reference, edges of the four corners of the side walls 72 abut on circuit substrate 6 to prevent the cover 7 from falling into the housing 2.

The shield cover 8 is formed of a single metal plate, such as a copper plate. As shown in FIGS. 2 and 5, it comprises a rectangular top plate 81, a pair of first side plates 82 obtusely bent and formed at two long sides of the top plate 81, auxiliary side plates 83 bent and formed at the two sides of the first side plates 82, a pair of second side plates 84 bent and formed at the two short sides of the top plate 81, engaging holes 85 formed closer to free-end sides of the auxiliary side plates 83, cut-and-raised tabs 86 formed closer to ends of the second side plates 84 to be snap-fitted in the engaging holes 85, fall-out prevention tabs 87 for the housing 2 which are formed at the ends of the second side plates 84, and fixing tabs 88 for an installation substrate 110 which are formed at the ends of the first side plates 82.

According to the above arrangements, the first side plates 82 widen by more than 90 degrees to the top plate 81 and are brought toward each other, and the cut-and-raised tabs 86 are snap-fitted into the engaging holes 85. In this way, the square-box-like shield cover 8, as shown in FIG. 5, is formed.

Hereinbelow, referring to FIG. 13, description will be given of polarization of the piezoelectric material used for the vibrator 1.

In order to provide ceramics, which is a piezoelectric material, with piezoelectric effects, polarization is performed to provide the material with dielectric polarization directions as indicated by the arrows in FIG. 12.

In this embodiment, an arrangement is made so that six vibrators 1 (FIG. 11) are created from a single piezoelectric ceramic board 101. For the creation of the six vibrators 1, the piezoelectric ceramic board 101 is cut along broken lines 102 which define the material in the longitudinal direction of the vibrators 1 and along broken lines 103 which are to become the end faces 1B of the vibrators 1. In this case, the vibrators 1 are provided with polarization patterns alternately on the front and back sides and a plurality of the vibrators 1 are created. Corresponding polarization patterns are also formed on the back side of the piezoelectric ceramic board 101 shown in FIG. 13.

Figure 13:
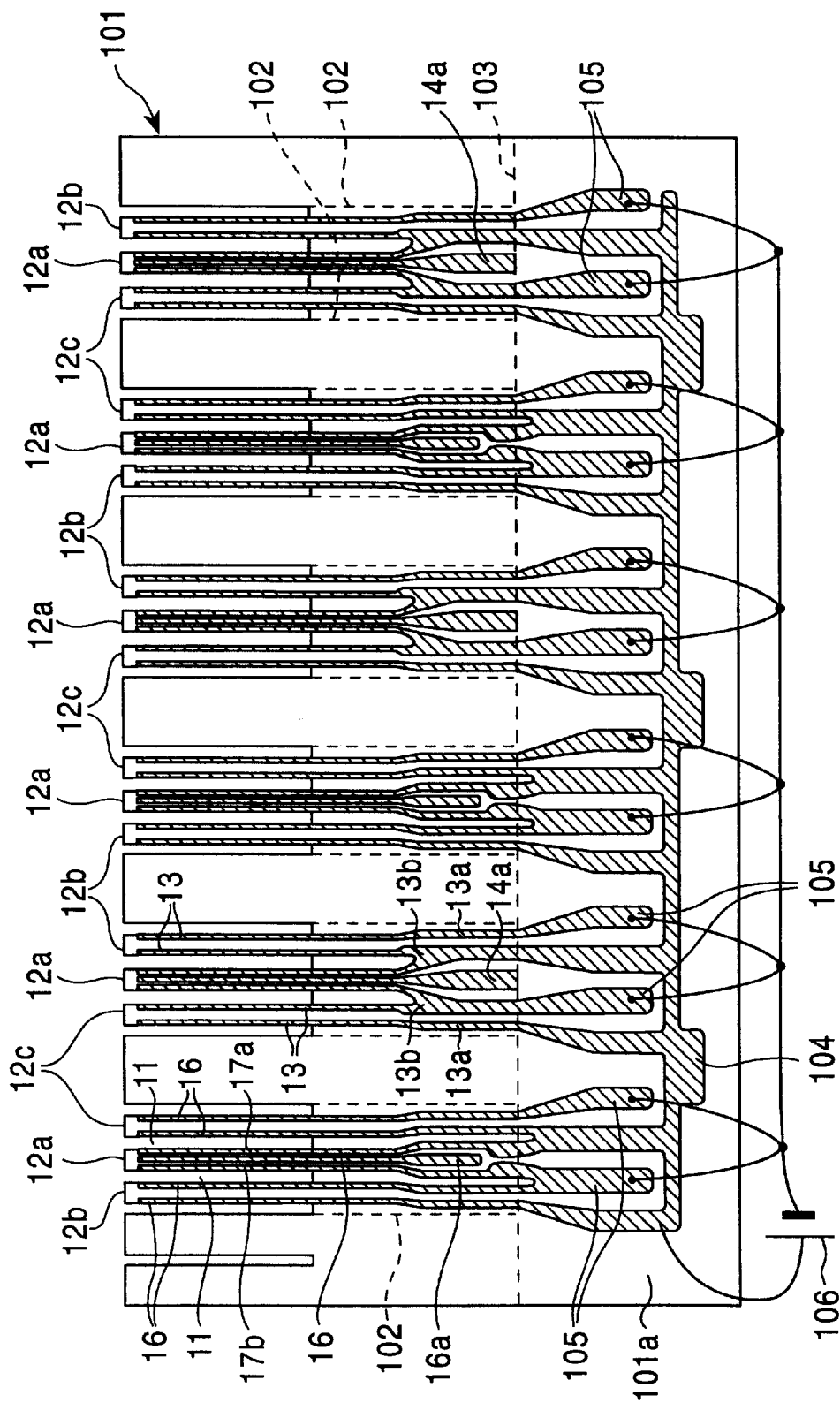
FIG. 13 is an explanatory drawing to be used for explanation of a manufacturing method and a polarization method for the vibrator.

In particular, in FIG. 13, at one side end of the piezoelectric ceramic board 101, three vibration arms 12b, 12a, and 12c which are to be surfaces of the first vibrator, as viewed from the left, are separately formed with the gaps 11, and at a right-adjacent area of the vibration arm 12c, the vibration arms 12c, 12a, and 12b which are to be surfaces of the second vibrator are formed with predetermined intervals. In the same manner as that above, there are formed vibration arms 12b, 12a, and 12c which are to be surfaces of the third vibrator in the right-adjacent area of the back side of the second vibrator, vibration arms 12c, 12a, and 12b which are to be surfaces of the third vibrator in the right-adjacent area of the back side of the third vibrator, and so on. In this manner, six vibration arms are formed alternately with respect to the front and back sides.

As described earlier, the pair of detection electrodes 17a and 17b and one grounding electrode 16 between them are formed on the individual vibration arms 12a, and the pair of grounding electrodes 16 is formed on each of the individual vibration arms 12b and 12c. As also described earlier, the pair of driving electrodes 13 and one grounding electrode 14 between them are formed on the individual vibration arms 12a, and the pair of driving electrodes 13 are formed on each of the individual vibration arms 12b and 12c.

Hereinbelow, a more detailed description will be given with reference to the front side of the piezoelectric ceramic board 101 shown in FIG. 13 as an example.

The left grounding electrode 16 of the vibration arm 12b which is the surface of the first vibrator as viewed from the left, voltages of the same potential in polarization are applied to the detection electrode 17a of the right vibration arm 12a and the left grounding electrode 16 of the vibration arm 12c. Therefore, these electrodes are incorporated in one conductive pattern 104 in a polarization-pattern forming section 101a in an area below the cutting line 103 of the piezoelectric ceramic board 101.

The left driving electrodes 13 of the vibration arm 12c, the right driving electrodes 13 of the vibration arm 12a, and left driving electrodes 13 of the vibration arm 12b are connected to the common conductive pattern 104, to which voltages of the same potential are applied, in the back side (the front side in FIG. 13) of the second vibrator as viewed from the left. Thereafter, the electrodes are connected to the common conductive pattern 104 alternately from the left in the same manner as that of the above first vibrator for the odd-numbered vibrators (faces corresponding to the front side faces) and in the same manner as that of the second vibrator for the even-numbered vibrators (faces corresponding to the back side faces).

Furthermore, the right grounding electrode 16 of the vibration arm 12b and the left detection electrode 17b of the vibration arm 12a of the first vibrator are connected to a conductive pattern 105 extending independently to the polarization-pattern forming section 101a of the piezoelectric ceramic board 101 in a manner such that these electrodes are not electrically connected to the common conductive pattern 104. The right grounding electrode 16 of the vibration arm 12c of the first vibrator is also connected to a conductive pattern 105 extending independently to the polarization-pattern forming section 110a of the piezoelectric ceramic board 101 in a manner such that this electrode is not electrically connected to the common conductive pattern 104.

For reference, the grounding electrode 14 and the grounding electrode 16 of the vibration arm 12a are not used for polarization. Since they are shorter, as described above, they are not connected to the common conductive pattern 104 nor conductive pattern 105.

In this way, the six vibrators are formed on the piezoelectric ceramic board 101, the individual electrodes connected to the conductive pattern are connected to the positive electrode and the common conductive pattern 104 are connected to the positive electrode of a direct current (DC) power source 106, and twelve independent conductive patterns 105 are connected to the negative electrode of the direct current power source 106. The piezoelectric ceramic board 101 is subjected to polarization in which it is immersed in silicon oil heated at 100 to 200° C. and 1-kV to 2-kV DC voltage is applied therethrough from the DC power source 106 for 1 to 3 hours, as shown in FIG. 12. After the completion of polarization, the piezoelectric ceramic board 101 is cut along the cutting lines 102 and 103 to create the six vibrators 1 shown in FIG. 11.

As described above, the driving electrodes 13 formed outside of both sides of the vibration arms 12b and 12c and the land sections 13a and 16a of the grounding electrodes 16 extend up to the end face 1B, not to a side end of the vibrators 1, and can be further extended; therefore, a pattern such as that to be extended from the side end of the base end section 1A of the vibrator 1 is not necessary and the interval between the vibrators on the piezoelectric ceramic board 101 can be smaller, i.e., the piezoelectric ceramic board 101 can be used more effectively. This reduces the cost for manufacturing the vibrators.

Next, referring to FIGS. 14 to 18, a detailed description will be given of arrangements including connection relationships regarding the flexible wiring board 5.

For forming the flexible wiring board 5, a film-like plate made of a synthetic resin, such as polyimide or polyethylene, at a total thickness of about 50 $\mu$m and a width of 1 to 1.5 mm (a wiring section 5d between the vibrator and the circuit substrate) can be used. For this embodiment, in consideration of heat resistance, it is formed of the polyimide resin. As described earlier and as shown in FIG. 14, the flexible wiring board 5 has on one end the vibrator-front-side-connection end section 5a and the vibrator-back-side-connection end section 5b, which are thermal-welded on the land sections of the front and back sides of the vibrator 1. On another end, it also has substrate-connection end section 5c, which is to be connected to a conductive pattern (not shown) of the circuit substrate 6. These vibrator-front-side-connection end section 5a, vibrator-back-side-connection end section 5b, and substrate-connection end section 5c are connected through the belt-like wiring section 5d. The wiring section 5d originates centrally from each of the connection sections 5a, 5b, and 5c to maintain the balance.

Figure 14:
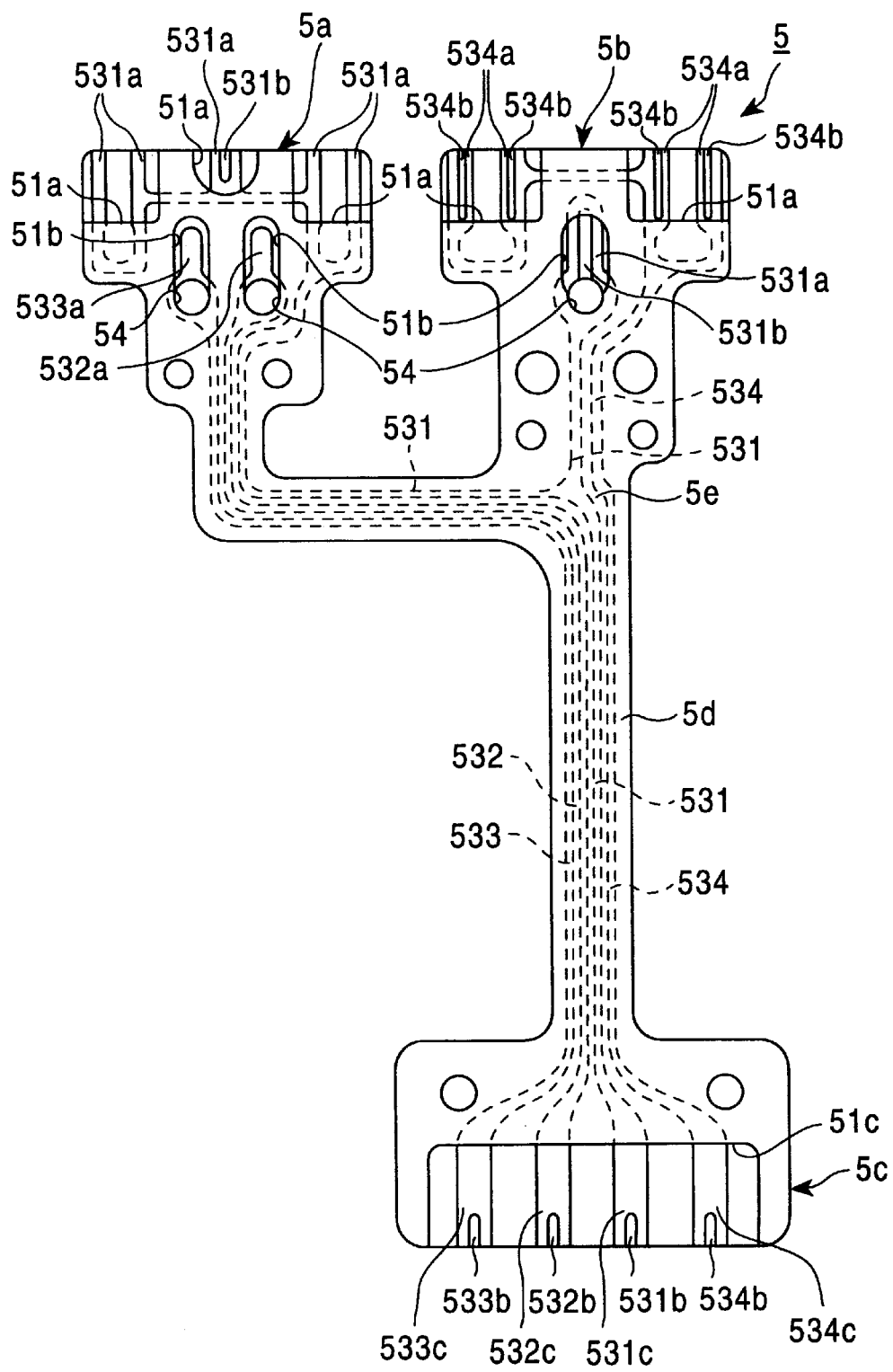
FIG. 14 is a detailed plan view showing a flexible wiring board.
Figure 18A:
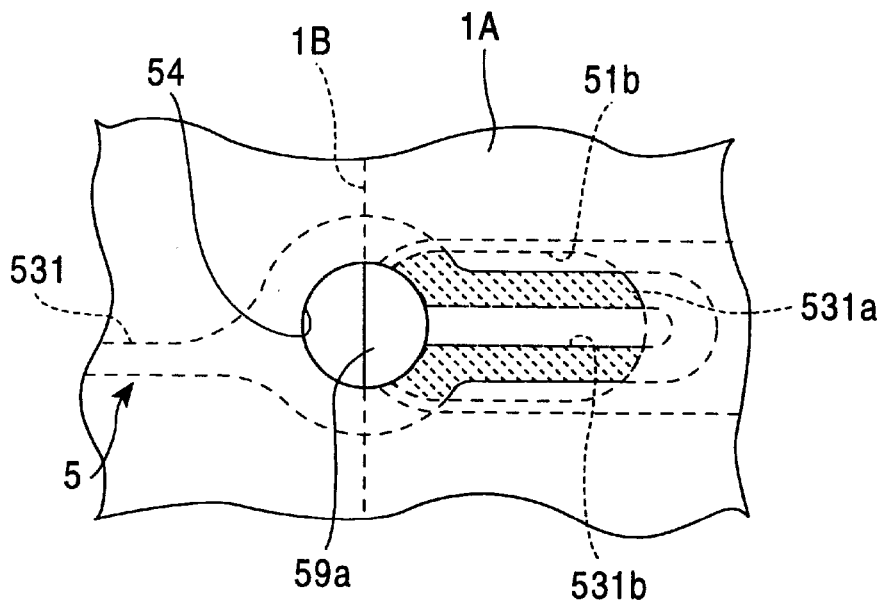
FIG. 18A is a partial plan view showing a portion where the vibrator and the flexible wiring board are soldered.
Figure 18B:
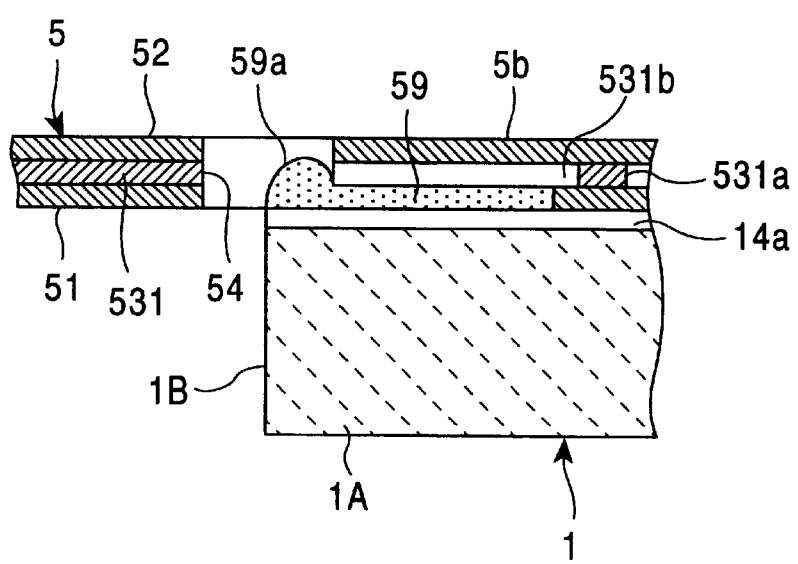
FIG. 18B is a partial cross-sectional view showing the portion shown in FIG. 18A.

As shown in FIGS. 14 and 18(B), the flexible wiring board 5 is arranged in a single unit through wiring patterns 531 to 534 which are sandwiched by films 51 and 52. In particular, the wiring patterns 531 to 534 formed of silver foil and the individual land sections such as the 531a electrically connected to the individual wiring patterns are etching-formed at the same time on the film 52 that is a base material, and the protection film 52 (cover film) is pasted on the film 52 with an adhesive to prevent the wiring patterns from short-circuiting or other problems.

As shown in FIG. 14, on the vibrator-front-side-connection end section 5a of the flexible wiring board 5, a land section 531a of the wiring pattern 531 and land sections 532a and 533a of the two wiring patterns 532 and 533 are formed. These land sections 531a, 532a, and 533a are exposed from a notch section 51a or an opening section 51b formed on the film 51 so as to be soldered.

Figure 15:
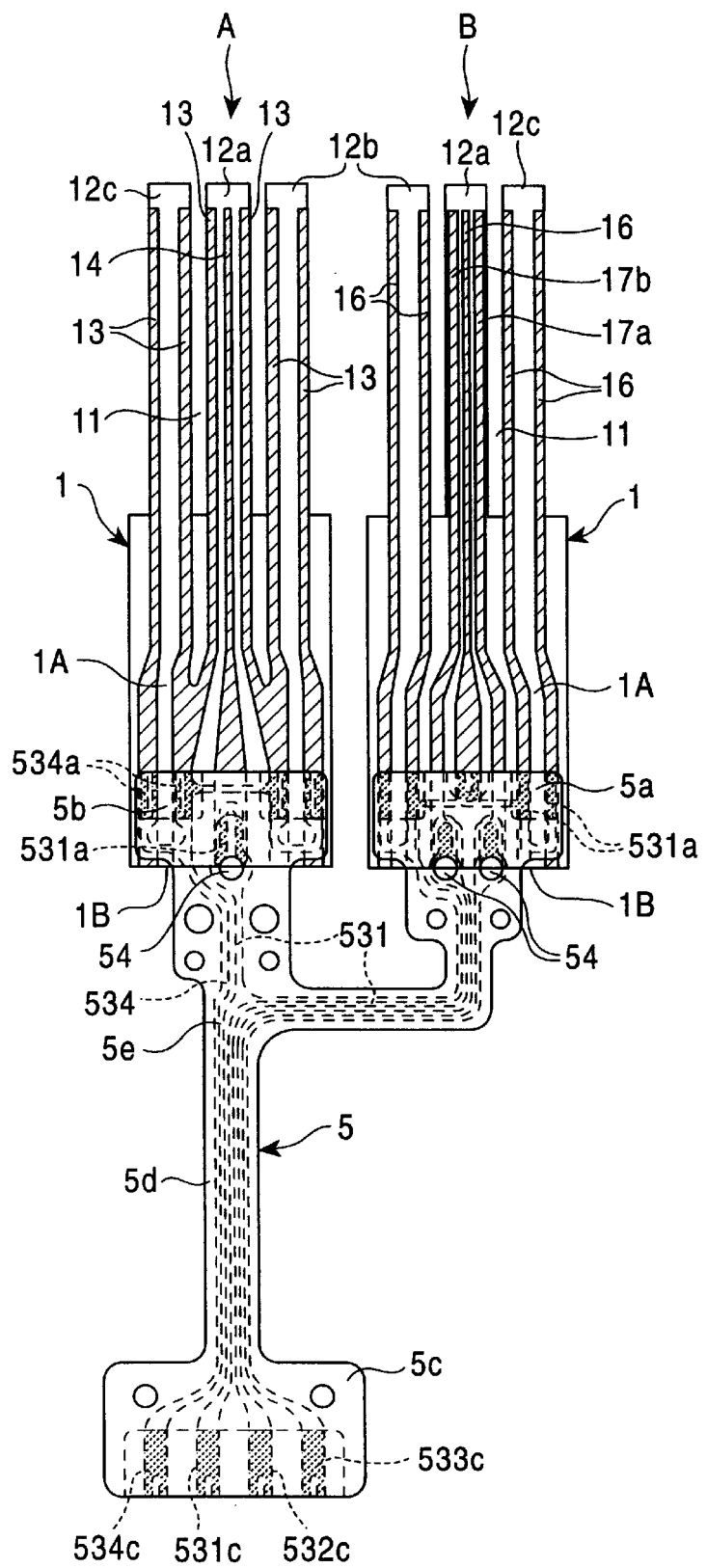
FIG. 15 shows enlarged rear and front views (explanatory drawings) illustrating a connected state of the vibrator and the flexible wiring board.
Figure 16:
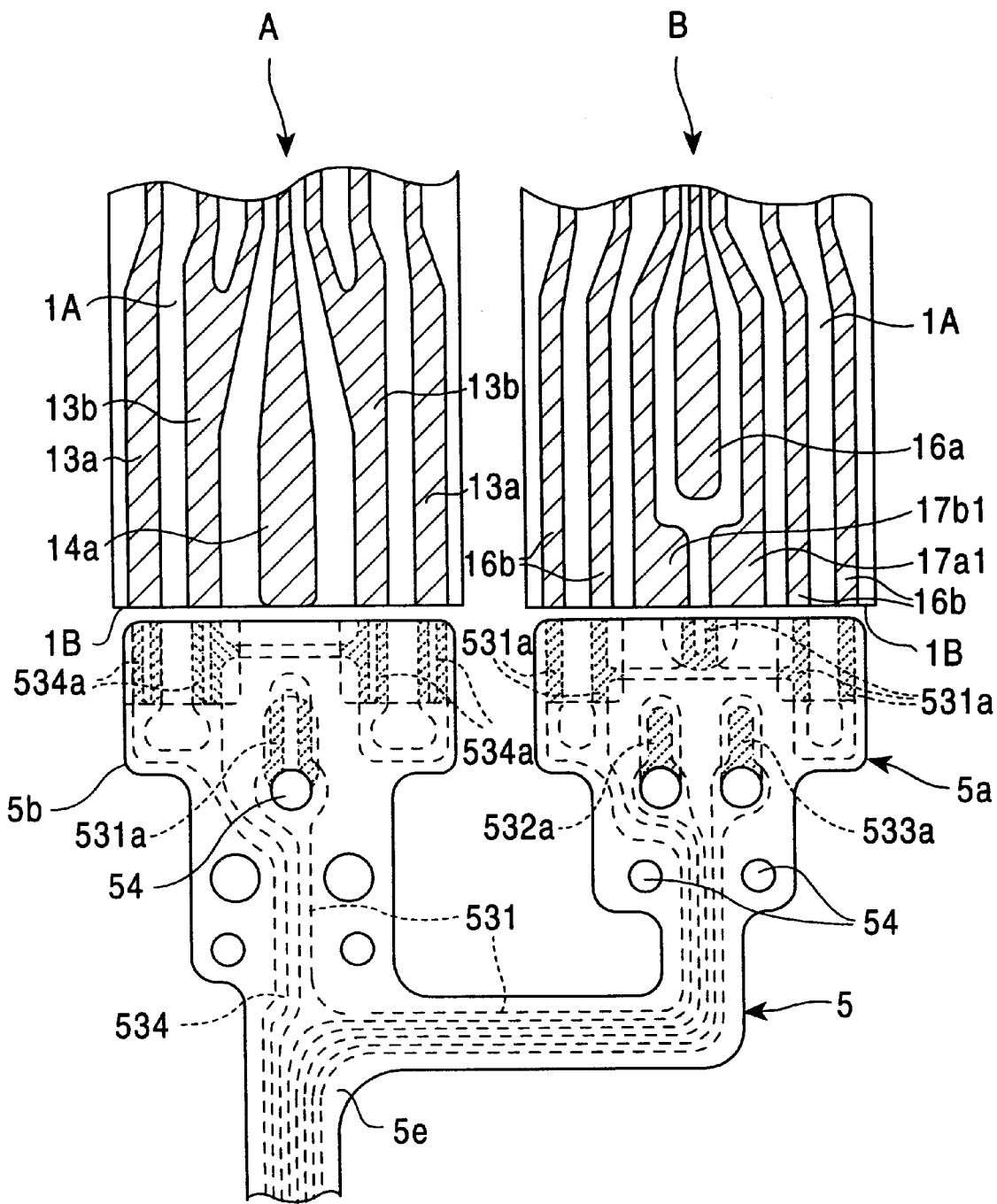
FIG. 16 illustrates enlarged rear and front views (explanatory drawings) which show the correlation between connected portions of the vibrator and the flexible wiring board.
Figure 17:
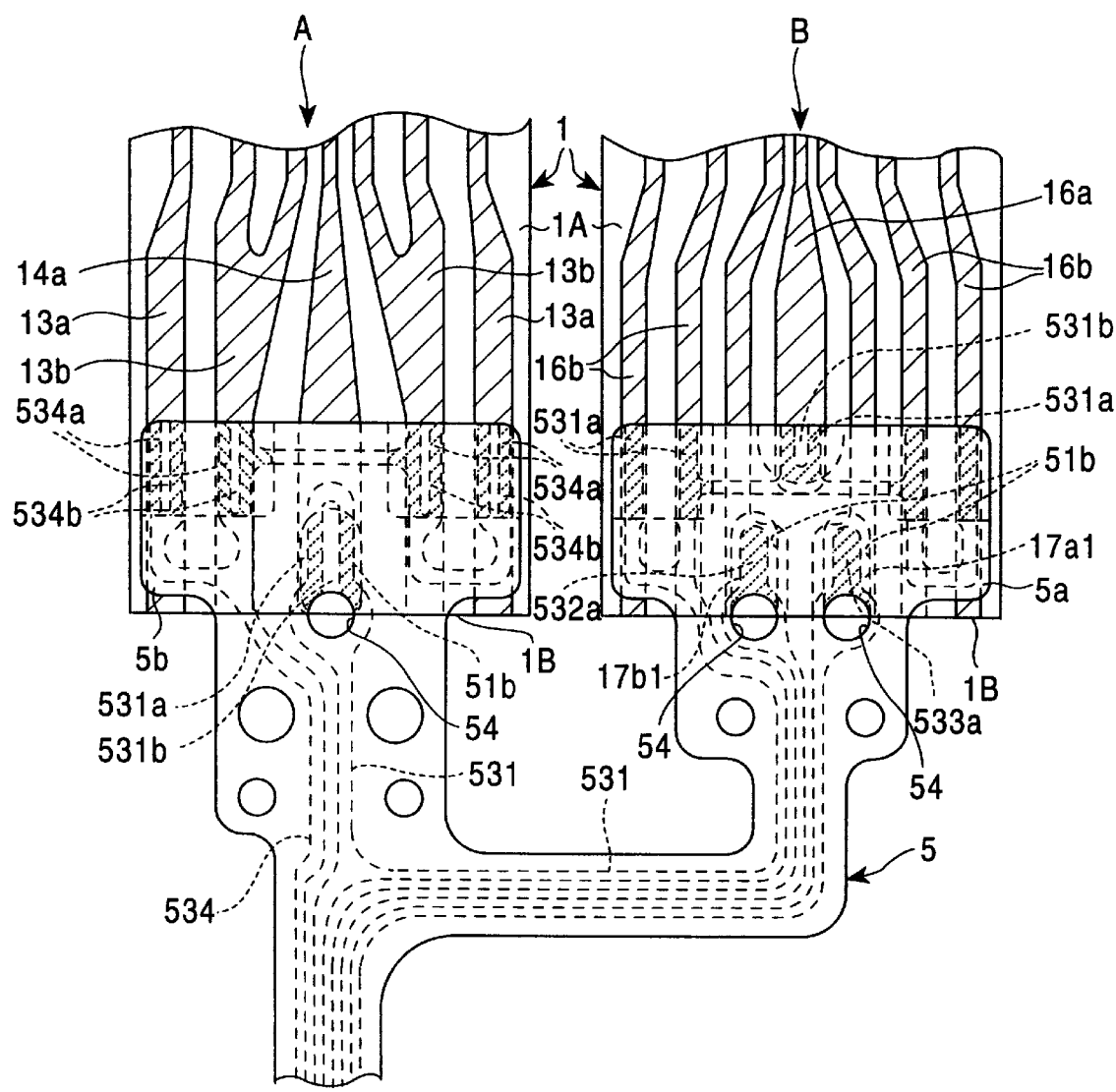
FIG. 17 depicts enlarged rear and front views (explanatory drawings) illustrating a connected state of the vibrator and the flexible wiring board.

As shown in FIGS. 15 to 17, the land sections 531a of the vibrator-front-side-connection end section 5a are connected to the individual land sections 16b of the two grounding electrodes of the vibration arm 12b, the land section 16a of the middle grounding electrode 16 of the vibration arm 12a, and the individual land sections 16b of the two grounding electrodes 16 of the vibration arm 12c. The land sections 532a and 533a of the wiring patterns 532 and 533 are connected to the land sections 17b1 and 17a1 of the two detection electrodes 17b and 17a of the vibration arm 12a, respectively. The individual land sections 16b of the two grounding electrodes 16 of the vibration arm 12b, the land section 16a of the middle grounding electrode 16 of the vibration arm 12a, and the individual land sections 16b of the two grounding electrodes 16 of the vibration arm 12c, which are to have the same potentials, are connected through the single continuous wiring pattern 531.

As shown in FIG. 14, on the vibrator-back-side-connection end section 5b of the flexible wiring board 5, four land sections 534a of the wiring pattern 534 and the single land section 531a electrically connected to the wiring pattern 531 are formed. As shown in FIGS. 15 to 17, the individual land sections 534a of the vibrator-back-side-connection end section 5b are connected to the land section 13a of the left driving electrode 13 of the vibration arm 12c, the land section 13b which is common to the right driving electrode 13 of the vibration arm 12c and left driving electrode 13 of the vibration arm 12a, the land section 13b commonly electrically connected to the right driving electrode 13 of the vibration arm 12a and the left driving electrode 13 of the vibration arm 12b, and the land section 13a of the right driving electrodes 13 of the vibration arm 12b. The land section 531a of wiring section 531 is connected to the land section 14 of the middle land section 14 of the vibration arm 12a.

For reference, the wiring section 5d is branched into two sections at a branch section 5e of the vibrator-front-side-connection end section 5a and the vibrator-back-side-connection end section 5b, and the land section 531a is connected to the wiring pattern 531 branched at the branch section 5e. These land sections 534a and 531a are also exposed from the notch section 51a or the opening section 51b formed on the film 51 so as to be soldered.

The driving electrodes 13 connected as described above have the same potentials; therefore, they are connected to the single wiring pattern 534. According to this arrangement, a total of 14 electrodes of the front and back sides are formed on the vibrator 1; however, as a result of grouping of the electrodes for the same potential, only the four wiring patterns 531 to 534 need to be formed in the wiring section 5d. The reduced wiring patterns allows the width of the wiring section 5d to be reduced in scale compared to those of the vibrator-front-side-connection end section 5a, the vibrator-back-side-connection end section 5b, and others.

By the arrangement in which the width of wiring section 5d is narrowed, the wiring section 5d becomes easily flexible to easily absorb vibration; therefore, vibration is not significantly transferred from the circuit substrate 6 to the vibrator 1, and conversely, is not significantly transferred from the vibrator 1 to the circuit substrate 6. This allows a detection signal obtained from the vibrator 1 to be relatively free of undesirable vibration influences.

Furthermore, as can be seen in FIG. 3 showing the flexible wiring board 5 (wiring section 5d), because of a U-shaped section between the vibrator 1 and circuit substrate 6, the wiring section 5d can be arranged to be elastic. In this case, vibration can be easily absorbed in this U-shaped section and undesirable vibration is not significantly transferred between the vibrator 1 and the circuit substrate 6.

In FIG. 14, 531b and 534b represent slits formed in the land sections 531a and 534a to retain melted solder. In addition, slits 531b, 532b, 533b, and 534b are formed in land sections 531c, 532c, 533c, and 534c of the substrate-connection end section 5c. These land sections 531c, 532c, 533c, and 534c are also exposed from the notch section 51c formed on the film 51 so as to be soldered.

Corresponding to land sections 13a, 13b, 14a, 16a, 16b, 17a1, and 17b1 of the vibrator 1, the individual wiring patterns 531 to 534 of the vibrator-front-side-connection end section 5a and vibrator-back-side-connection end section 5b, which are thermal-welded, comprise solder 59 (hatched portion in FIGS. 15 to 17) formed of solder paste, solder-plating, or the like, on the silver foil that is formed by etching. These solder 59 is allowed to melt by thermal-welding to connect the land sections 13a, 13b, 14a, 16a, 16b, 17a1, and 17b1 and the land sections 531a, 532a, 533a, and 534a of the wiring patterns 531 to 534, as shown in FIG. 17. In particular, the vibrator-back-side-connection end section 5b is arranged so that the corresponding land sections 534a, 534a, 531a, 534a, and 534a abut on the back-side land sections 13a, 13b, 14a, 13b, and 13a of the vibrator 1. Then, a heating tip is used to abut on, press, and heat the back side (film 52 side) of the vibrator-back-side-connection end section 5b. After the solder 59 melts and the relative land sections are connected, heating is terminated; and after the solder 59 is allowed to harden, the pressure given through the heating tip is released. This procedure is also applied to connect the land sections on the front side of the vibrator 1 and the corresponding land sections of the vibrator-front-side-connection end section 5a.

By the above arrangements, although a plurality of the land sections 534a, 534a, 531a, 534a, and 534a and the wiring patterns are formed, a single-time thermal-welding connection for each of the front and back sides of the vibrator 1 is sufficient. This improves efficiency of assembly processing.

On the soldered sections, an adhesive, such as a thermal-curing adhesive, cold-curing adhesive, or ultraviolet-curing adhesive (not shown), may be applied. In this embodiment, considering characteristics of fast curability, usability in processing, and strength, a ultraviolet-curing adhesive (UV-curing adhesive) of a acrylic resin type is applied to coat the soldered sections. The application of this UV-curing resin protects and reinforces the soldered sections (connected section of the vibrator 1 and the flexible wiring board 5).

Furthermore, the land sections 531a and 534b of the wiring patterns 531 and 534 (among the four wiring patterns 531 to 534) which are thermal-welded to the comparatively wider land sections 13a, 13e, 14a, and 16a can be arranged to have a larger width. This allows the land sections 531a and 534a to be made narrower, in spite of the fact that in this embodiment the slits 531b and 534b are formed in the center portions of the land sections 531a and 534a, in which case the patterns of the land sections 531a and 534a are likely to be wider. Therefore, the solder 59 can be heated more quickly through these land sections 531a and 534a to allow the solder to melt easily. The melted solder 59 flows into the slits 531b and 534b to allow complete thermal welding in a shorter time. Furthermore, since the melted solder 59 flows into the slits 531b and 534b, the soldering condition can be visually confirmed.

In the same manner as in the case of the vibrator-backside-connection end section 5b, the individual land sections 531c to 534c arranged in the substrate-connection end section 5c are thermal-welded by use of the solder with corresponding conductive patterns (not shown), and the UV-curing adhesive is coated on the connections for reinforcement.

Furthermore, a description will be given, referring to FIG. 18 as an example, which is illustrative of a section of the solder 59 of the wiring pattern 531 that is thermal-welded with the land section 14a.

As shown in FIGS. 15 to 18, a vent 54 is provided on the vibrator-back-side-connection end section 5b of the flexible wiring board 5 so as to be positioned on the end face 1B of the vibrator 1, which is connected to the vibrator 1. Furthermore, the vent 54 is communicated with the slit 531b of the land section 531a of the vibrator-back-side-connection end section 5b (although the slit 531b has the film 52). Accordingly, the vibrator-back-side-connection end section 5b and the vibrator 1 are overlaid and thermal-welded, the solder 59 melts, the remaining solder 59 fills in the slit 531b, and excess solder 59a is retained in a portion where the land section 14a exists in the vent 54.

For reference, as shown in FIGS. 14 to 17, the vent 54 that forms such a solder-retaining section is also arranged in section partially across the land sections 532a and 533a of the vibrator-front-side-connection end section 5a that is soldered with the land sections 17b1 and 17a1 of the vibrator 1.

Although the invention has been described through its preferred forms, it is to be understood that these embodiments are only illustrative and various changes and modifications may be imparted thereto without departing from the scope of the invention which is limited solely by the appended claims.

What is claimed is:

1. A vibratory gyroscope comprising:
   a vibrator having electrodes and land sections electrically connected to said electrodes;
   a holding member holding said vibrator to vibrate;
   a flexible wiring board comprising a wiring section having wiring patterns, vibrator-side end sections and a circuit-substrate-side end section, the wiring section positioned between the vibrator-side end sections and the circuit-substrate-side end section, the vibrator-side end sections comprising land sections electrically connected to the wiring patterns and electrically connected to the land sections of the vibrator; and
   a circuit substrate connected to land sections arranged on the circuit-substrate-side end section of said flexible wiring board and electrically connected to the wiring patterns.

2. A vibratory gyroscope according to claim 1, wherein said wiring section of said flexible wiring board is narrower than the vibrator-side end sections and the circuit-substrate-side end section.

3. A vibratory gyroscope according to claim 1, wherein a plurality of the land sections of said vibrator are arranged to be adjacent to each other and have the same potential.

4. A vibratory gyroscope according to claim 1, wherein said vibrator comprises vibration arms individually having a free end and vibrating in a state wherein one end is held, a base end section of said vibrator is held by said holding member, the land sections of the vibrator-side end sections are arranged in contact with the base end section of said vibrator, and said holding member is fixed with the circuit substrate.

5. A vibratory gyroscope according to claim 4, wherein said vibrator is formed as a plate and comprises one of driving and detection electrodes on front and back sides thereof and the land sections of the vibrator are electrically connected to said one of driving and detection electrodes;

said flexible wiring board comprises a branch section in which the wiring section branches into two sections, one on each side of said vibrator rather than a center of said vibrator, one vibrator-side end section for the front side of said vibrator, and the other vibrator-side end section for the back side of said vibrator; and land sections arranged in each of the vibrator-side end sections are connected to corresponding land sections formed on the front and back sides of said vibrator.

6. A vibratory gyroscope according to claim 5, wherein the wiring patterns individually electrically connected to the land sections of said vibrator, having the same potentials in the front and back sides of the vibrator, are incorporated in the branch section and directed to the circuit-substrate-side end section.

7. A vibratory gyroscope according to claim 5, wherein the wiring section is centrally disposed in each vibrator-side end section.

8. A vibratory gyroscope according to claim 5, wherein paste consisting essentially of silver is printed to form the electrodes and land sections of said vibrator, solders of solder paste or solder plating are arranged in the land sections of the vibrator-side end sections of said flexible wiring board, and the solders melted by thermal welding to connect the land sections of said vibrator and the land sections of said flexible wiring board.

9. A vibratory gyroscope according to claim 8, wherein an adhesive is applied in to protect and reinforce the soldered sections thermal-welded to connect land sections of said vibrator and land sections of said flexible wiring board.

* * * * *